(12) United States Patent
Li et al.

(10) Patent No.: US 11,955,774 B2
(45) Date of Patent: Apr. 9, 2024

(54) ELLIPTICAL MULTI-MESA LASER STRUCTURE

(71) Applicant: Shenzhen Technology University, Shenzhen (CN)

(72) Inventors: Hui Li, Shenzhen (CN); Jian Feng, Shenzhen (CN); Chuyu Zhong, Shenzhen (CN); Wei Miao, Shenzhen (CN); Shilong Zhao, Shenzhen (CN); Zhao Chen, Shenzhen (CN)

(73) Assignee: SHENZHEN TECHNOLOGY UNIVERSITY, Shenzhen (CN)

( * ) Notice: Subject to any disclaimer, the term of this patent is extended or adjusted under 35 U.S.C. 154(b) by 0 days.

(21) Appl. No.: 18/346,206

(22) Filed: Jul. 1, 2023

(65) Prior Publication Data

US 2024/0072517 A1 Feb. 29, 2024

(30) Foreign Application Priority Data

Aug. 23, 2022 (CN) .......................... 202211014903.6

(51) Int. Cl.
*H01S 5/183* (2006.01)
*H01S 5/30* (2006.01)

(52) U.S. Cl.
CPC ........ *H01S 5/1835* (2013.01); *H01S 5/18313* (2013.01); *H01S 5/1833* (2013.01); *H01S 5/18347* (2013.01); *H01S 5/3013* (2013.01)

(58) Field of Classification Search
CPC .. H01S 5/1835; H01S 5/18313; H01S 5/1833; H01S 5/18347; H01S 5/3013
See application file for complete search history.

(56) References Cited

U.S. PATENT DOCUMENTS

| | | | | |
|---|---|---|---|---|
| 5,956,363 | A | * | 9/1999 | Lebby ................. H01S 5/18311 372/96 |
| 6,720,583 | B2 | * | 4/2004 | Nunoue ................ H01L 33/105 257/E33.068 |
| 2019/0067906 | A1 | * | 2/2019 | Yuen ..................... G02B 6/4206 |
| 2019/0222000 | A1 | * | 7/2019 | Ledentsov ............ H01S 5/1833 |

FOREIGN PATENT DOCUMENTS

| | | |
|---|---|---|
| JP | 2002353562 A | 12/2002 |
| JP | 2011003820 A | 1/2011 |

* cited by examiner

*Primary Examiner* — Yuanda Zhang
(74) *Attorney, Agent, or Firm* — Stuart H. Mayer; Kaplan Breyer Schwarz LLP

(57) ABSTRACT

Provided is an elliptical multi-mesa laser structure, including a substrate layer, an N-DBR, a functional layer and a P-DBR sequentially arranged from bottom to top. The substrate layer is fixedly connected with an N contact layer. The N-DBR is fixedly connected to a top of the substrate layer, and the N contact layer is arranged around the N-DBR. A space layer is inserted in the N-DBR. The functional layer is fixedly connected to a top of the N-DBR. The P-DBR is fixedly connected to a top of the functional layer, and a top of the P-DBR is fixedly connected with a P contact layer. Another space layer is inserted into the P-DBR.

5 Claims, 2 Drawing Sheets

ELLIPTICAL MULTI-MESA LASER STRUCTURE

CROSS-REFERENCE TO RELATED APPLICATIONS

This disclosure claims priority to Chinese Patent Application No. 202211014903.6, filed on Aug. 23, 2022, the contents of which are hereby incorporated by reference.

TECHNICAL FIELD

The disclosure relates to the technical field of semiconductor lasers, and in particular to an elliptical multi-mesa laser structure.

BACKGROUND

A vertical cavity surface emitting laser (VCSEL) is a semiconductor laser whose light emitting direction is perpendicular to a surface of a chip. Compared with conventional lasers, the VCSEL has advantages of a small size, circular spots, wide corresponding frequency bands and easy realization of two-dimensional array integration. The VCSEL has important applications in optical fiber communication systems, gyroscopes, atomic clocks and other fields.

However, a conventional VCSEL has many limitations. Firstly, the conventional VCSEL adopts a single-layer circular or square mesa, a single oxide layer and a reflector layer with a single structure. This method has problems of a poor heat dissipation environment of the mesa, non-uniform current injection caused by high free carrier absorption in a p-doped layer and poor mobility of a p-type layer of the laser, a large spectral line width, and a need to improve monochromaticity of light extraction.

There are currently two main uses for introducing space layers into surface emitting laser structures. One is to apply the space layers to quantum wells to increase gain spectrum widths and get flat gains in a wide temperature range. The other is to replace a high AL component AlxGal-xAs material in BDR with the space layers to reduce DBR logarithm and increase a contrast refractive index, so as to reduce series resistance and light absorption.

However, an existing laser transmitter has poor monochromaticity and thermal stability of the light extraction, a low current injection efficiency and a poor output and conversion power, thus affecting efficiency of the VCSEL. Therefore, an elliptical multi-mesa laser structure is urgently needed to solve the above problems.

SUMMARY

An objective of the disclosure is to provide an elliptical multi-mesa laser structure to solve problems existing in the prior art.

In order to achieve the above objectives, the disclosure provides a following scheme: the disclosure provides the elliptical multi-mesa laser structure, including:
- a substrate layer, where an N contact layer is fixedly connected to the substrate layer;
- an N-DBR, where the N-DBR is fixedly connected to a top of the substrate layer, and the N contact layer is arranged around the N-DBR; and a space layer is inserted into the N-DBR;
- a functional layer, where the functional layer is fixedly connected to a top of the N-DBR; and
- a P-DBR, where the P-DBR is fixedly connected to a top of the functional layer, and a top of the P-DBR is fixedly connected to a P contact layer; and another the space layer is inserted into the P-DBR.

Optionally, the functional layer includes a confinement layer group fixedly connected to the N-DBR, where a top of the confinement layer group is fixedly connected to the P-DBR; and an active layer is embedded and fixedly connected in the confinement layer group.

Optionally, the confinement layer group includes an upper oxidation confinement layer group and a lower oxidation confinement layer group respectively fixedly connected on upper and lower end faces of the active layer; a bottom of the lower oxidation confinement layer group is fixed on a top surface of the N-DBR, and a top surface of the upper oxidation confinement layer group is fixedly connected to a bottom surface of the P-DBR.

Optionally, the upper oxidation confinement layer group and the lower oxidation confinement layer group each include several AlxGaAs oxide layers, and the upper oxidation confinement layer group and the lower oxidation confinement layer group are symmetrically arranged with respect to the active layer.

Optionally, the N-DBR includes four pairs of stacked and fixedly connected AlAs/GaAs with a quarter-wavelength optical thickness, and the space layer with a same refractive index as the AlAs is interposed between the four pairs of AlAs/GaAs, and a thickness of the space layer is n times a half-wavelength optical thickness.

Optionally, the P-DBR includes four pairs of stacked and fixedly connected AlAs/GaAs with a quarter-wavelength optical thickness, and the another space layer with a same refractive index as the GaAs is interposed between the four pairs of AlAs/GaAs, and a thickness of the space layer is n times a half-wavelength optical thickness.

Optionally, the substrate layer is made of an opaque material.

Optionally, a buffer layer is fixedly connected between the substrate layer and the N-DBR, and the N contact layer is fixedly connected to a top surface of the buffer layer.

The disclosure has following technical effects. The disclosure provides an elliptical multi-mesa laser structure, where the substrate layer is a first elliptical cylinder, the N-DBR, the functional layer and the P-DBR have same outer diameters to form a second elliptical cylinder, and the first elliptical cylinder and the second elliptical cylinder are coaxially arranged, which is convenient for heat dissipation of a laser. The space layer is respectively inserted into the N-DBR and the P-DBR, thereby narrowing spectral line widths; Combined with heat dissipation of a mesa of the first elliptical cylinder and a mesa of the second elliptical cylinder and limitation of the functional layer on a current, monochromaticity and thermal stability of light extraction are improved, an injection efficiency of the current is optimized, an output power and a conversion efficiency of a device are improved, and a performance of the laser is optimized.

BRIEF DESCRIPTION OF THE DRAWINGS

In order to explain technical schemes of the disclosure or technical schemes in the prior art more clearly, drawings needed in embodiments are briefly introduced below. Obviously, the drawings in a following description are only some embodiments of the disclosure. For ordinary people in the field, other drawings may be obtained according to these drawings without paying a creative labor.

DETAILED DESCRIPTION OF THE EMBODIMENTS

In the following, technical schemes in embodiments of the disclosure may be clearly and completely described with reference to attached drawings. Obviously, the described embodiments are only a part of the embodiments of the disclosure, but not all embodiments. Based on the embodiments in the disclosure, all other embodiments obtained by ordinary technicians in the field without a creative labor belong to a scope of protection of the disclosure.

In order to make above objects, features and advantages of the disclosure more obvious and easier to understand, the disclosure may be further described in detail with the attached drawings and specific embodiments.

Figure 1:
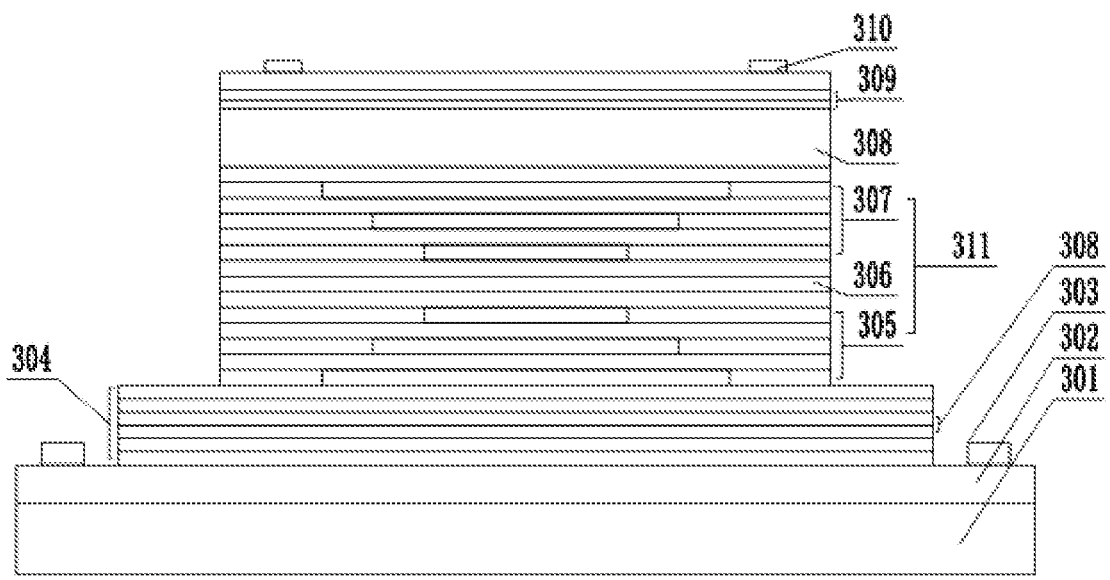
FIG. 1 is a schematic structural diagram of an elliptical multi-mesa laser according to the disclosure.
Figure 2:
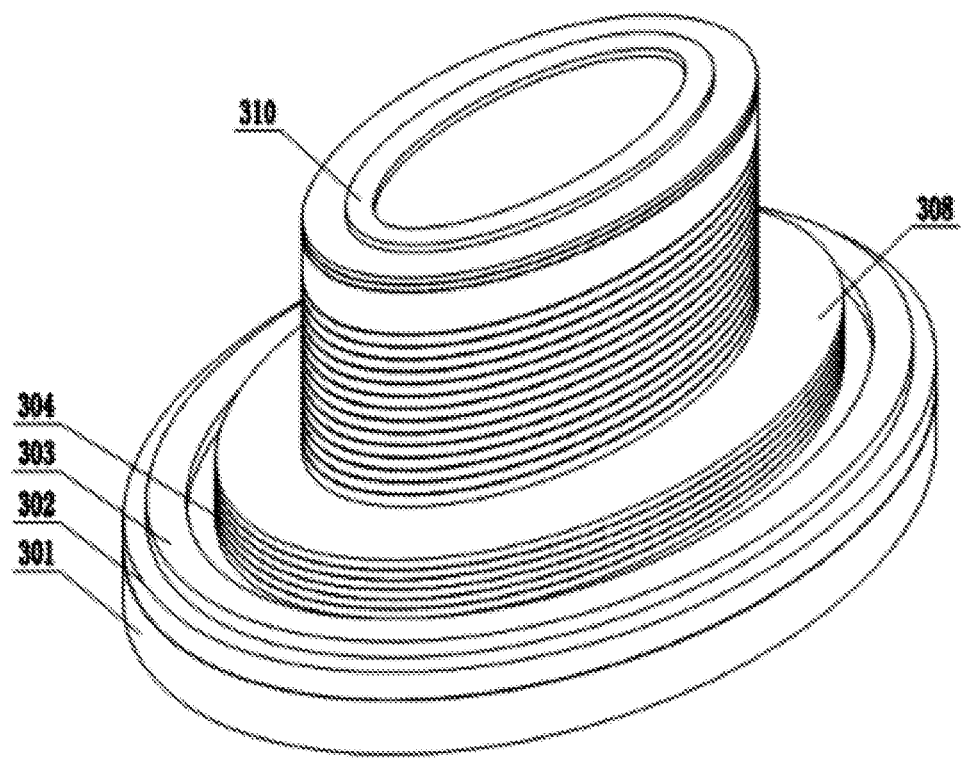
FIG. 2 is an axial view of an elliptical multi-mesa laser structure according to the disclosure.

With reference to FIG. 1 and FIG. 2, the disclosure provides an elliptical multi-mesa laser structure, including:
- a substrate layer 301, where an N contact layer 303 is fixedly connected to the substrate layer 301;
- an N-DBR 304, where the N-DBR 304 is fixedly connected to a top of the substrate layer 301, and the N contact layer 303 is arranged around the N-DBR 304; and a space layer 308 is inserted into the N-DBR 304;
- a functional layer 311, where the functional layer 311 is fixedly connected to a top of the N-DBR 304; and
- a P-DBR 309, where the P-DBR 309 is fixedly connected to a top of the functional layer 311, and a top of the P-DBR 309 is fixedly connected to a P contact layer 310. Another space layer 308 is inserted into the P-DBR 309.

The disclosure provides the elliptical multi-mesa laser structure, where the substrate layer 301 is a first elliptical cylinder, the N-DBR 304, the functional layer 311 and the P-DBR 309 have same outer diameters to form a second elliptical cylinder, and the first elliptical cylinder and the second elliptical cylinder are coaxially arranged, which is convenient for heat dissipation of a laser. The space layer 308 is respectively inserted into the N-DBR 304 and the P-DBR 309, thereby narrowing spectral line widths. Combined with heat dissipation of a mesa of the first elliptical cylinder and a mesa of the second elliptical cylinder and limitation of the functional layer 311 on a current, monochromaticity and thermal stability of light extraction are improved, an injection efficiency of the current is optimized, an output power and a conversion efficiency of a device are improved, and a performance of the laser is optimized.

Further, both the first elliptical cylinder and the second elliptical cylinder according to the disclosure use dry etching. According to anisotropy of a material etching rate and according to a numerical value of an etching rate in each direction, a direction with a fast etching rate is designed as a short axis part of an ellipse, and a direction with a slow etching rate is set as a long axis part of the ellipse, so that an etching aperture may obtain a better circular pattern.

Further, DBR, also known as a distributed Bragg reflector, is a periodic structure composed of two materials with different refractive indices alternately arranged in an ABAB mode. An optical thickness of each layer is ¼ of a central reflection wavelength, and is a quarter-wavelength multilayer system, equivalent to a simple group of photonic crystals. Reflectivity of the Bragg reflector may reach more than 99% because an electromagnetic wave whose frequency falls within an energy gap may not penetrate. Generally, in terms of improving brightness of a light-emitting diode (LED), the Bragg reflector does not have an absorption problem of a metal mirror, and may adjust an energy gap position by changing a refractive index or a thickness of a material.

In another embodiment, the functional layer 311 includes a confinement layer group fixedly connected to the N-DBR 304, where a top of the confinement layer group is fixedly connected to the P-DBR 309. An active layer 306 is embedded and fixedly connected in the confinement layer group. The confinement layer group includes an upper oxidation confinement layer group 307 and a lower oxidation confinement layer group 305 respectively fixedly connected on upper and lower end faces of the active layer 306. A bottom of the lower oxidation confinement layer group 305 is fixed on a top surface of the N-DBR 304, and a top surface of the upper oxidation confinement layer group 307 is fixedly connected to a bottom surface of the P-DBR 309. When in use, carriers are transported to the active layer 306 through the upper oxidation confinement layer group 307 and the lower oxidation confinement layer group 305 for composite luminescence.

Further, the lower oxidation confinement layer group 305 is a P-type confinement layer, and the upper oxidation confinement layer group 307 is an N-type confinement layer.

Further, the active layer 306 is a layer or an active region that provides optical gain in a semiconductor injection laser or a light emitting diode. The active layer 306 includes several sublayers, each of the sublayers may have its own lattice constant. The active layer 306 includes a plurality of quantum wells with compressive strain quantum well layers and common tensile strain barrier layers. Electrons are injected into the active layer 306 from an N-type side (a side close to the upper oxidation confinement layer group 307) and holes are injected from a P-type side (a side close to the lower oxidation confinement layer group 305). Recombination of the electrons and the holes in the active layer 306 generates photons, so the laser works and emits light.

In another embodiment, the upper oxidation confinement layer group 307 and the lower oxidation confinement layer group 305 each include several AlxGaAs oxide layers, and the upper oxidation confinement layer group 307 and the lower oxidation confinement layer group 305 are symmetrically arranged with respect to the active layer 306. X in each of the AlxGaAs oxide layers is in a range of 0.94-1.

Further, the upper oxidation confinement layer group 307 and the lower oxidation confinement layer group 305 are provided with elliptical oxide holes, an aperture of a long axis of each of the elliptical oxide holes ranges from 1 to 10 and a thickness of each of the layers in the upper oxidation confinement layer group 307 and the lower oxidation confinement layer group 305 ranges from 10 to 30 nm.

Further, in the disclosure, each of the upper oxidation confinement layer group 307 and the lower oxidation confinement layer group 305 includes six layers of the AlxGaAs oxide layers.

In a further optimization scheme, the N-DBR 304 includes four pairs of stacked and fixedly connected AlAs/GaAs with a quarter-wavelength optical thickness, and the space layer 308 with a same refractive index as the AlAs is interposed between the four pairs of AlAs/GaAs, and a thickness of the space layer 308 is n times a half-wavelength optical thickness. The P-DBR 309 includes four pairs of stacked and fixedly connected AlAs/GaAs with a quarter-wavelength optical thickness, and another the space layer 308 with a same refractive index as the GaAs is interposed between the four pairs of AlAs/GaAs, and a thickness of the space layer 308 is n times a half-wavelength optical thickness. The N-DBR 304 layer is composed of the four pairs of AlAs/GaAs with the quarter-wavelength optical thickness, and the single space layer 308 with an optical thickness of $\lambda/2$ and a refractive index the same as the AlAs is inserted into one to four pairs of N-DBR 304. The P-DBR 309 layer is composed of the four pairs of AlAs/GaAs with the quarter-wavelength optical thickness, and the single space layer 308 with the optical thickness of $\lambda/2$ and a refractive index the same as the GaAs is inserted into one to four pairs of P-DBR 309, that is, 1-8 space layers 308 may be inserted into the DBR. An average refractive index contrast of the inserted single $\lambda/2$ space layer 308 to a designed wavelength remains unchanged, so power reflectivity to this wavelength remains unchanged. However, other wavelengths are affected. Therefore, with an increase of the inserted space layer 308, a cut-off band width is also narrowed. Meanwhile, the N-DBR 304 layer is composed of the four pairs of AlAs/GaAs with the quarter-wavelength optical thickness, and the space layer 308 with the optical thickness of $n\lambda/2$ (n=1, 2, 3 . . . ) and the same refractive index as the AlAs is inserted. With an increase of the inserted space layer 308, a power reflection spectrum changes in a design wavelength, a maximum incident power emissivity of the DBR increases significantly, and the cut-off bandwidth narrows more significantly.

In another embodiment, the substrate layer 301 is made of an opaque material. The substrate layer 301 is a device base and plays a supporting role.

Further, both the N-DBR 304 and the P-DBR 309 adopt AlxGa1-xAs Bragg reflectors with graded components, and x is in a range of 0.1-1.

In another embodiment, a buffer layer 302 is fixedly connected between the substrate layer 301 and the N-DBR 304, and the N contact layer 303 is fixedly connected to a top surface of the buffer layer 302. A purpose of buffer layer 302 is to facilitate installation of the N-DPR and improve earthquake resistance.

Further, the P contact layer 310 is doped with a P-type doping layer with a concentration higher than $3\times1018$ cm3, so as to realize a metal ohmic structure. A thickness of the P contact layer 310 is greater than 15 nm, and the P contact layer is placed at a node of an optical field.

Preparation Method

The laser structure is provided, including the substrate layer 301, the N contact layer 303, the N-DBR 304, the functional layer 311, the P-DBR 309 and the P contact layer 310 arranged from bottom to top, and the P contact layer 310 is plated with P electrodes.

The P-DBR 309 and the functional layer 311 are etched to obtain the mesa of the second elliptical cylinder, where the mesa of the second elliptical cylinder has a long axis of 18-30 μm and is formed by ICP-RIE etching. Oxide confined apertures with different sizes are formed in the upper oxidation confinement layer group 307 and the lower oxidation confinement layer group 305 through a wet oxidation process, and a radius size of minimum apertures in the upper oxidation confinement layer group 307 and the lower oxidation confinement layer group 305 is less than 7 μm.

The mesa of the first elliptical cylinder is obtained by etching to the buffer layer 302, a mesa size of the first elliptical cylinder is larger than that of the second elliptical cylinder, and the size is approximately equal to the mesa size of the second elliptical cylinder is about +30 μm. The mesa of the first elliptical cylinder is formed by the ICP-RIE etching. The N contact layer 303 is plated with N electrodes, and finally the elliptical multi-mesa laser structure according to the disclosure is obtained.

The space layer 308 is respectively inserted into the N-DBR 304 and the P-DBR 309 according to the disclosure, so that the spectral line widths are narrowed. Combining the heat dissipation of the mesa of the first elliptical cylinder and the mesa of the second elliptical cylinder and the limitation of the functional layer 311 on the current, the monochromaticity and the thermal stability of the light extraction are improved, the current injection efficiency is optimized, the output power and the conversion efficiency of the device are improved, and the performance of the laser is optimized.

In a description of the disclosure, it should be understood that terms "vertical", "horizontal", "up", "down", "front", "back", "left", "right", "vertical", "horizontal", "top", "bottom", "inside", "outside", and other indications of orientation or positional relationships are based on orientation or positional relationships shown in accompanying drawings, solely for a convenience of describing the disclosure, rather than indicating or implying that a device or a component referred to must have a specific orientation, be constructed and operated in a specific orientation, therefore it may not be understood as a limitation of the disclosure.

The above-mentioned embodiments only describe preferred modes of the disclosure, and do not limit a scope of the disclosure. Under a premise of not departing from a design spirit of the disclosure, various modifications and improvements made by ordinary technicians in the field to the technical scheme of the disclosure shall fall within a protection scope determined by claims of the disclosure.

What is claimed is:

1. An elliptical multi-mesa laser structure, comprising:
a substrate layer, wherein an N contact layer is fixedly connected to the substrate layer;
an N-DBR, wherein the N-DBR is fixedly connected to a top of the substrate layer, and the N contact layer is arranged around the N-DBR; and a space layer is inserted into the N-DBR;
a functional layer, wherein the functional layer is fixedly connected to a top of the N-DBR; and
a P-DBR, wherein the P-DBR is fixedly connected to a top of the functional layer, and a top of the P-DBR is fixedly connected to a P contact layer; and another the space layer is inserted into the P-DBR;
wherein the functional layer comprises a confinement layer group fixedly connected to the N-DBR, wherein a top of the confinement layer group is fixedly connected to the P-DBR; and an active layer is embedded and fixedly connected in the confinement layer group;
the confinement layer group comprises an upper oxidation confinement layer group and a lower oxidation confinement layer group respectively fixedly connected on upper and lower end faces of the active layer; a bottom of the lower oxidation confinement layer group is fixedly connected to a top surface of the N-DBR, and a top surface of the upper oxidation confinement layer group is fixedly connected to a bottom surface of the P-DBR; and
the upper oxidation confinement layer group and the lower oxidation confinement layer group each comprise several Al GaAs oxide layers where x is in a range of 0.94-1, and the upper oxidation confinement layer group and the lower oxidation confinement layer group are symmetrically arranged with respect to the active layer.

2. The elliptical multi-mesa laser structure according to claim 1, wherein the N-DBR comprises four pairs of stacked and fixedly connected AlAs/GaAs with a quarter-wavelength optical thickness, and the space layer with a same refractive index as the AlAs is interposed between the four pairs of AlAs/GaAs, and a thickness of the space layer is $n\lambda/2$ (where 'n' represents integers 1, 2, 3 . . . ) corresponding to a half-wavelength optical thickness.

3. The elliptical multi-mesa laser structure according to claim 2, wherein the P-DBR comprises four pairs of stacked and fixedly connected AlAs/GaAs with a quarter-wavelength optical thickness, and the another the space layer with a same refractive index as the GaAs is interposed between the four pairs of AlAs/GaAs, and a thickness of the another space layer is $n\lambda/2$ (where represents integers 1, 2, 3 . . . ) of a half-wavelength optical thickness.

4. The elliptical multi-mesa laser structure according to claim 1, wherein the substrate layer is made of an opaque material.

5. The elliptical multi-mesa laser structure according to claim 1, wherein a buffer layer is fixedly connected between the substrate layer and the N-DBR, and the N contact layer is fixedly connected to a top surface of the buffer layer.

\* \* \* \* \*